United States Patent [19]

DeVolder

[11] Patent Number: 5,032,692
[45] Date of Patent: Jul. 16, 1991

[54] PROCESS FOR MANUFACTORING HERMETIC HIGH TEMPERATURE FILTER PACKAGES AND THE PRODUCTS PRODUCED THEREBY

[75] Inventor: Norman E. DeVolder, Salem, N.H.

[73] Assignee: AVX Corporation, New York, N.Y.

[21] Appl. No.: 349,395

[22] Filed: May 9, 1989

[51] Int. Cl.⁵ .............................................. H05K 5/06
[52] U.S. Cl. ................................. 174/52.3; 29/25.42; 333/182; 333/184; 361/302
[58] Field of Search .................. 174/52.1, 52.2, 52.3, 174/52.4; 361/517, 518, 519, 520, 535, 536, 537, 538, 539, 302; 357/72; 228/122; 29/854, 855, 25.42; 333/182, 184

[56] References Cited

U.S. PATENT DOCUMENTS

| | | | |
|---|---|---|---|
| 2,785,350 | 3/1957 | Toppari | 361/302 |
| 2,825,855 | 3/1958 | Frekko | 361/519 |
| 2,983,855 | 5/1961 | Schlicke | 361/302 |
| 2,994,048 | 7/1961 | Schlicke | 333/182 |
| 3,056,072 | 9/1962 | Schroeder et al. | 361/519 |
| 3,320,557 | 4/1963 | Garstang | 333/182 |
| 3,533,832 | 10/1970 | DeVolder . | |
| 3,697,823 | 10/1972 | Correll | 317/230 |
| 3,896,543 | 7/1975 | Colliver et al. . | |
| 3,936,864 | 2/1976 | Benjamin . | |
| 3,961,295 | 6/1976 | Hollyday et al. | 333/183 |
| 3,969,640 | 7/1976 | Staudte . | |
| 4,016,527 | 4/1977 | Francis et al. . | |
| 4,023,198 | 5/1977 | Malone et al. . | |
| 4,131,935 | 12/1978 | Clement . | |
| 4,208,698 | 6/1980 | Narasimhan . | |
| 4,221,033 | 9/1980 | Kobayashi | 29/25.42 |
| 4,248,920 | 2/1981 | Yoshizumi et al. . | |
| 4,266,156 | 5/1981 | Kizaki . | |
| 4,326,180 | 4/1982 | Ferri . | |
| 4,372,037 | 2/1983 | Scapple et al. . | |
| 4,380,041 | 4/1983 | Ho . | |
| 4,410,874 | 10/1983 | Scapple et al. . | |
| 4,420,652 | 12/1983 | Ikeno . | |
| 4,446,502 | 5/1984 | Boser et al. . | |
| 4,477,828 | 10/1984 | Scherer . | |
| 4,560,826 | 12/1985 | Burns et al. . | |
| 4,590,617 | 5/1986 | Kraemer . | |
| 4,608,592 | 8/1986 | Miyamoto . | |
| 4,633,573 | 1/1987 | Scherer . | |
| 4,639,632 | 1/1987 | Nakata et al. . | |
| 4,678,890 | 7/1987 | Sorrow . | |
| 4,687,540 | 8/1987 | Singhdeo et al. . | |
| 4,700,440 | 10/1987 | Sakamoto et al. | 29/25.42 |
| 4,725,480 | 2/1988 | Gurol . | |
| 4,730,232 | 3/1988 | Lindberg . | |
| 4,758,926 | 7/1988 | Herrell et al. . | |

Primary Examiner—Leo P. Picard
Assistant Examiner—Bot L. Ledynh
Attorney, Agent, or Firm—Mark T. Basseches

[57] ABSTRACT

This invention relates to a hermetically sealed electronic component package and method for making the package. In one embodiment of the invention, the electronic component is mechanically and electrically attached to the package by heating rings of brazing material. In another embodiment of the invention, an insulative, inorganic preform is heated to mechanically attach the electronic circuit within the package housing. The package is then hermetically sealed by mounting a preform within an electronic component package and heating the combination to a second predetermined high temperature to cause the preform to flow.

7 Claims, 2 Drawing Sheets

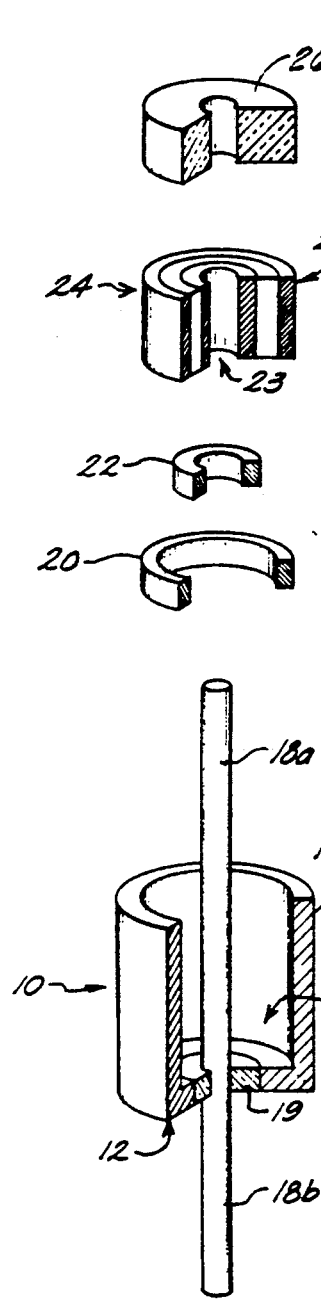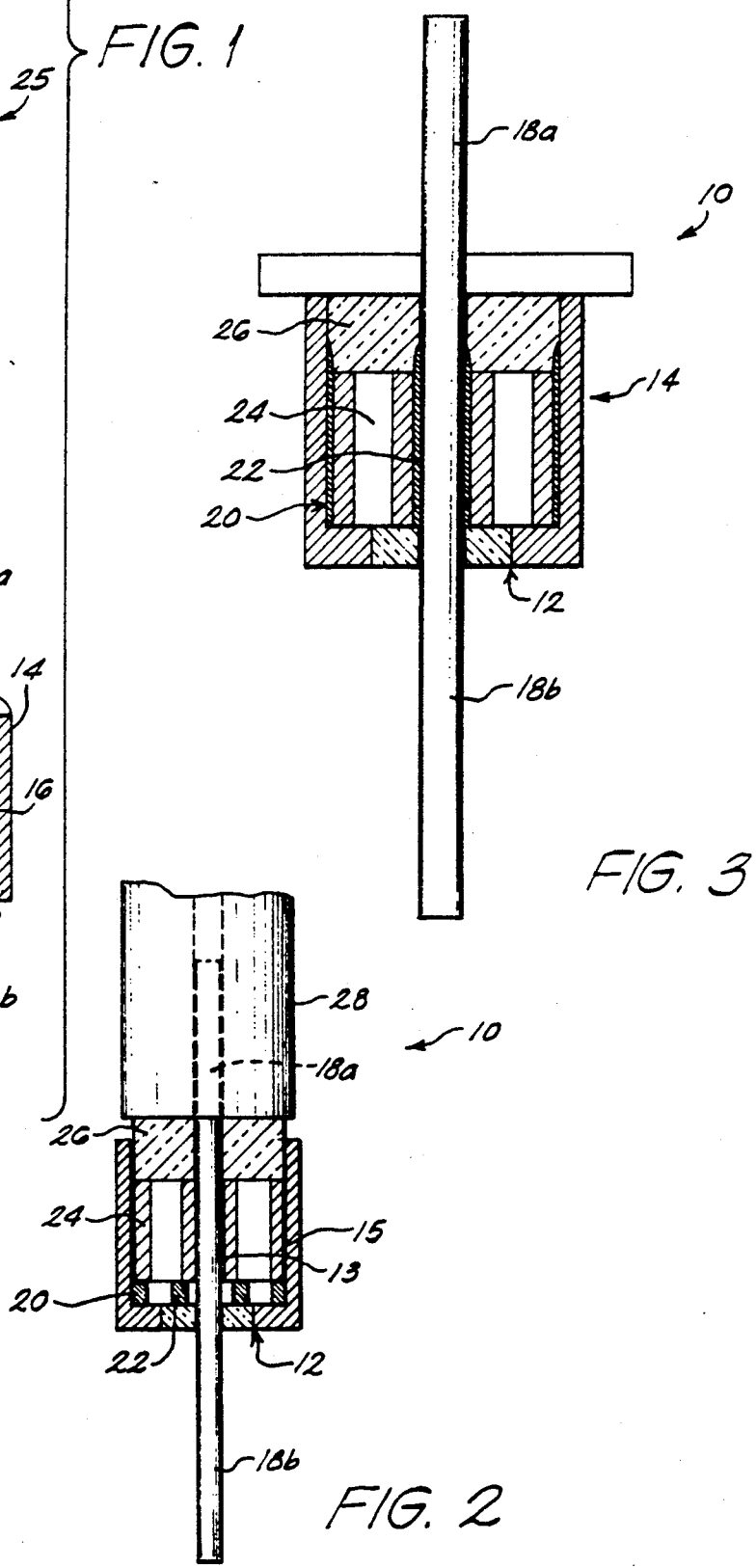
FIG. 1
FIG. 3
FIG. 2

PROCESS FOR MANUFACTURING HERMETIC HIGH TEMPERATURE FILTER PACKAGES AND THE PRODUCTS PRODUCED THEREBY

FIELD OF THE INVENTION

The present invention relates to electronic components and more specifically to electronic components which are hermetically sealed within a housing by separate heating steps.

BACKGROUND OF THE INVENTION

Capacitor and filter manufacturing companies are presently attaching electronic components such as chips to their packages using epoxy and making electrical connection to the package and lead with solder, silver polyamide, or conductive epoxy and then sealing the package with epoxy.

One problem which results from using epoxies is that epoxies are difficult to apply, particularly on small packages which results in high labor costs and lower yields. Other problems which occur due to the use of epoxies in electronic component packages include instability of the epoxies at temperatures above 175 degrees centigrade, poor moisture resistance and low mechanical strength when used in thin sections. However, at the present time, there are few alternatives to using epoxy for chip attachment and package closure in high temperature electronic component packages. Industrial users of these electronic component packages would prefer to have an organic free package which is hermetic and which is cheaper to make.

SUMMARY OF THE INVENTION

The present invention provides a superior, high temperature electronic component package which contains no organic materials, can withstand high temperatures and is hermetically sealed. The present invention further provides an electronic component package which is cheaper to make due to the use of preforms which are used to attach the chip to the package as well as seal the package. The preforms are inexpensive, may be readily formed by conventional manufacturing techniques and require much less labor and processing to assemble as compared to using epoxies. Thus, the assembly yields for electronic component packages made according to the present invention are much higher than the assembly yields of packages made using epoxy.

In the first embodiment of the present invention, chip attachment and electrical contact are achieved through the use of brazing rings which are placed in the package housing along with the chip. The package housing is ideally a cylindrical cup having an axial lead secured to the bottom wall by way of a glass to metal seal and having a cylindrical capacitor chip disposed within the cavity of the cylindrical cup. When the housing, the brazing rings and the chip are heated to about 710 degrees centigrade the brazing rings flow between the chip, the housing walls and the axial lead providing electrical contact throughout the package and also securing the chip to the package. The package is hermetically sealed using a glass preform which is placed into the package and on top of the chip. A weight is placed on top of the glass preform to hold the preform firmly in place during the heating process. The package is heated a second time to about 600 degrees centigrade in a nitrogen atmosphere. The preform flows and seals to the lead, the housing and to the chip.

In an alternative embodiment of the present invention, chip attachment is achieved by using a glass preform which secures the chip to the bottom wall of the package housing. Electrical contact between the chip, the housing and the axial lead is made by fitting the chip over the axial lead and into the package housing and using a conductive paste applied to the inner and outer terminals of the chip after placing the chip over the axial lead and into the package housing.

In the alternative embodiment, a glass preform is mounted in the package housing and the chip is placed on top of the preform. The package is heated to about 600 degrees centigrade in a nitrogen atmosphere. The glass preform flows and secures the chip to the bottom wall of the package housing. The package is made hermetic by mounting a glass preform in the package housing on top of the chip, placing a weight on top of the preform, and heating the package to about 450 degrees centigrade in a nitrogen atmosphere. The preform flows and seals to the housing, the lead and to the chip.

DESCRIPTION OF THE DRAWINGS

The invention will be more fully understood from the following detailed description taken in conjunction with the accompanying drawings in which:

FIG. 1 is an exploded perspective partially sectioned view of a first embodiment of the present invention;

FIG. 2 is a cross sectional view of the first embodiment of the present invention including a glass preform being held in place by a weight;

FIG. 3 is a cross sectional view of the first embodiment including the glass preform hermetically sealed to the package;

DESCRIPTION OF THE INVENTION

Figure 4:
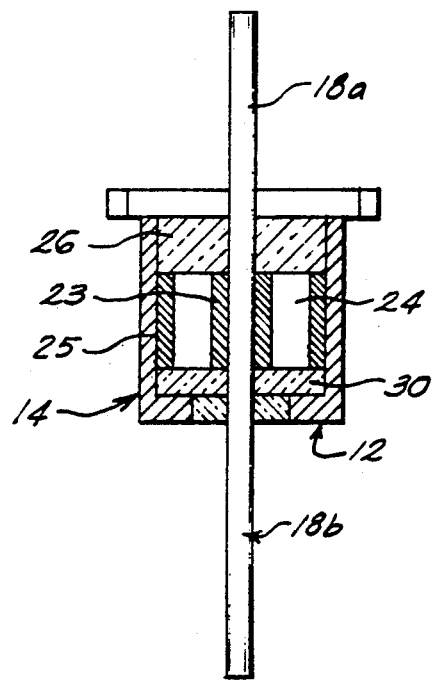
FIG. 4 is a cross sectional view of a second embodiment of the present invention.

The following invention will be described with reference to a hermetically sealed electronic component package as well as with reference to the process for making such hermetically sealed electronic component package.

Referring to FIGS. 1, 2 and 3 there is shown one embodiment of an electronic component package according to the present invention which includes a conductive housing 10 having one bottom wall 12 and at least one sidewall 14 defining an internal cavity 16. The conductive housing is commonly cylindrical as pictured in FIG. 1. However, any other shape may be within the scope of the present invention. The conductive housing 10 includes a single axial lead 18 secured to the bottom wall 12 by means such as a glass seal 19 and extending outwardly from the bottom wall 18b and open top 18a for connecting the electronic component package to an electronic circuit (not shown).

Also shown in FIG. 1 is the assembly of the electronic component package. To assemble the electronic component package, a brazing ring 20 with a diameter slightly less than the diameter of the cavity 16 of the conductive housing 10 is disposed in the cavity of the housing to abut the bottom wall 12. Another brazing ring 22 with a diameter slightly greater than the diameter of the axial lead 18 is disposed into the cavity 16 of the housing 10 to abut the bottom wall 12. An electronic component 24 having an inner terminal 23 and an outer terminal 25 such as a discoidal chip capacitor is mounted in the cavity 16 of the housing 10 and on top of the brazing rings 20 and 22. When the parts are assembled as described, a small gap 15 exists between the discoidal chip 24 and the housing wall 14 and another small gap 13 exists between the chip 24 and the axial lead 18 as shown in FIG. 2. With the parts assembled as described, the package is heated a first time to about 710 degrees centigrade in a nitrogen atmosphere in order to melt the brazing rings 20, 22 to cause flow into the gaps 13, 15, respectively. The melted brazing rings 20, 22 provide electrical contact between the housing walls 12, 14, the axial lead 18, and the discoidal chip 24 as well as providing for attachment of the discoidal chip 24 to the housing 10.

Referring to FIG. 2 there is shown the assembled package of FIG. 1 including a glass preform 26 having a diameter which is slightly less than the diameter of the cavity 16 and which may be fitted into the housing cavity 16 to abut the discoidal chip 24. The glass preform 26 may be made of a non-conductive material such as INNOTECH 510. In order to hermetically seal the glass preform to the electronic component package, a weight 28 is placed over the glass preform 26 and the entire package is heated a second time to about 600 degrees centigrade in a nitrogen atmosphere. The glass preform flows and seals to the axial lead 18, the housing walls 12, 14, and to the discoidal chip 24.

FIG. 3 illustrates a fully assembled, hermetically sealed electronic component package.

A second embodiment of the present invention is shown in FIG. 4. In this embodiment, the discoidal chip 24 is attached to the bottom wall 12 of the housing 10 using an attaching preform 30 which is made from INNOTECH 510 glass and which melts at about 600 degrees centigrade. The discoidal chip 24 may be designed to be press fit into the cavity 16 of the housing 10 in order to provide electrical contact between the housing wall 14 and the outer terminal 25 of the discoidal chip 24 and the axial lead 18 and the inner terminal 23 of the discoidal chip 24. Alternatively, the discoidal chip 24 may be designed to have a diameter which is slightly less than the diameter of the housing 10 and may have a conductive paste such as silver polyamide applied to its inner terminal 23 and outer terminal 25 to provide electrical contact between the discoidal chip 24 and the housing wall 14 and the axial lead 18.

The attaching preform 30 is mounted in the cavity 16 of the housing 10 to abut the bottom wall 12. The discoidal chip 24 is disposed in the cavity 16 to abut the glass preform. The package is then heated to a first temperature of about 600 degrees centigrade in a nitrogen atmosphere in order to melt the attaching preform 30 to secure the chip 24 to the bottom wall 12 of the housing 10. A glass preform made of a material such as Corning Glass 7575 and having a diameter which is slightly less than the diameter of the cavity 16 is mounted over the chip 24 and a weight such as the weight 28 described in FIG. 2 is placed on top of the chip. The package is then heated to a second temperature of about 450 degrees centigrade. The glass flows and seals to the lead 18a–18b, the housing wall 14 and to the chip 24.

Figure 5:
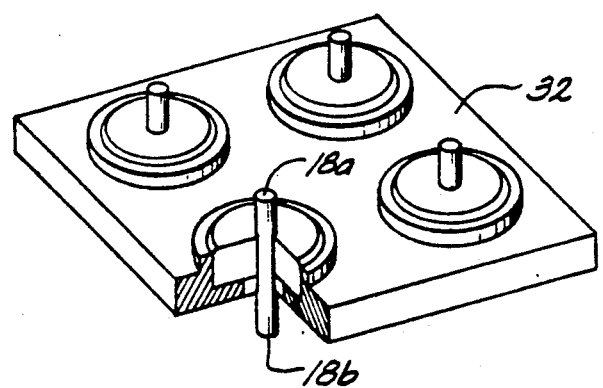
FIG. 5 is a perspective partially sectioned view of a hermetically sealed electronic multi-component package for use on a circuit board.

FIG. 5 illustrates a hermetically sealed multi-component package for use on a circuit board 32. The axial lead 18b may be attached to a computer circuit board and the axial lead 18a may be attached to some other electronic device.

As many possible embodiments may be made of the invention without departing from the scope thereof, it is to be understood that all matters set forth herein and shown in the accompanying drawings are to be interpreted in an illustrative and not a limiting sense.

What is claimed is:

1. A method of manufacturing a hermetically sealed electronic device having a conductive housing with a bottom wall, a side wall, an open top defining a cavity, and a lead extending through said bottom wall and said top, an electronic component within said cavity having a first terminal in proximate spaced relation to said lead and a second terminal in proximate spaced relation to said wall, comprising the steps of introducing a first metal component between said lead and first terminal, introducing a second metal component between said wall and said second terminal, said metal components having a lower melt temperature than said housing, electrical component and lead, thereafter heating said housing, electrical component and first and second metal components to a temperature above the melting point of said metal components, thereafter introducing a mass of class into said cavity through said top, and thereafter heating said mass of glass to a temperature above the melt point of said glass and below the melt point of said metal components to thereby cause said glass to flow and form a hermetic seal of said cavity.

2. The method of claim 1 wherein annular spaces are defined between said lead and said first terminal and between said wall and said second terminal respectively, and said first and said second metal components are annular in configuration.

3. The method in accordance with claim 2 wherein said mass of glass is an annular preform.

4. The method in accordance with claim 3 and including the step of supporting said mass of glass against a surface of said electronic component and applying a compressive force against said preform while said preform is above the melt point thereof, said compressive force being applied in a direction toward said bottom wall.

5. The method in accordance with claim 2 and including the step of supporting said mass of glass against a surface of said electronic and applying a compressive force against said mass of glass while said mass is above the melt point thereof, said compressive force being applied in a direction toward said bottom wall.

6. A hermetically sealed electronic device having a conductive housing with a bottom wall, a side wall, an open top defining a cavity, and a lead extending through said bottom wall and said top, an electronic component within said cavity having a first terminal in proximate spaced relation to said lead and a second terminal in proximate spaced relation to said wall, made by the method of introducing a first metal component between said lead and first terminal, introducing a second metal components between said wall and said second terminal, said metal components having a lower melt temperature than said housing, electronic component and lead, thereafter heating said housing, electronic component and first and second metal components to a temperature above the melting point of said metal components, thereafter introducing a mass of glass into said cavity through said top, and thereafter heating said mass of glass to a temperature above the melt point of said glass and below the melt point of said metal components to thereby cause said glass to flow and form a hermetic seal of said cavity.

7. A hermetically sealed electronic device having a conductive housing with a bottom wall, a side wall, an open top defining a cavity, and a lead extending through said bottom wall and said top, an electronic component within said cavity having a first terminal in proximate spaced relation to said lead and a second terminal in proximate spaced relation to said wall, made by the method of introducing a first metal component between said lead and first terminal, introducing a second metal component between said wall and said second terminal, said metal components having a lower melt temperature than said housing, electronic component and lead, thereafter heating said housing, electronic component and first and second metal components to a temperature above the melting point of said metal components, thereafter introducing a mass of glass into said cavity through said top, and thereafter heating said mass of glass to a temperature above the melt point of said glass and below the melt point of said metal components, applying a compressive force against said mass of glass in a direction toward said bottom wall to thereby cause said glass to flow and form a hermetic seal of said cavity.

* * * * *